United States Patent [19]

Matsumoto

[11] Patent Number: 4,700,231

[45] Date of Patent: Oct. 13, 1987

[54] SOLID STATE IMAGE SENSING DEVICE

[75] Inventor: Kazuya Matsumoto, Ina, Japan

[73] Assignee: Olympus Optical Co., Ltd., Japan

[21] Appl. No.: 722,399

[22] Filed: Apr. 12, 1985

[30] Foreign Application Priority Data

Apr. 17, 1984 [JP] Japan .................................. 59-77137

[51] Int. Cl.[4] ............................................. H04N 3/15
[52] U.S. Cl. ......................... 358/213.12; 358/213.16; 358/221; 357/24
[58] Field of Search ....................... 358/212, 213, 221; 357/24 LR, 24, 22, 30, 43

[56] References Cited

U.S. PATENT DOCUMENTS

| | | | |
|---|---|---|---|
| 4,232,331 | 11/1980 | Motoyama et al. | 358/44 |
| 4,293,877 | 10/1981 | Tsunekawa et al. | 358/213 |
| 4,484,223 | 11/1984 | Tsunekawa | 358/213 |
| 4,518,863 | 5/1985 | Fukuoka et al. | 250/578 |

FOREIGN PATENT DOCUMENTS 3125718  11/1978  Japan .................................. 358/221

OTHER PUBLICATIONS

"Static Induction Transistor Image Sensors", by Nishizawa et al., IEEE Transactions on Electron Devices, vol. ED-26, No. 12, Dec. 1979, pp. 1970—1977.

Primary Examiner—Robert Lev
Attorney, Agent, or Firm—Parkhurst & Oliff

[57] ABSTRACT

A solid state image sensing device including a number of pixels arranged in a matrix form and comprised of lateral or vertical static induction transistors formed in a semiconductor chip, and a dummy pixel array arranged along a column in the chip and shielded from an incident light input. When successive pixels on a row are read out to derive picture signals, a dummy pixel on the same row is repeatedly read out to derive dark signals in synchronism with the reading out operation for respective pixels on the same row. A differential amplifier is formed in the semiconductor chip to derive a difference signal between a picture signal and a dark signal which are read out simultaneously.

3 Claims, 50 Drawing Figures

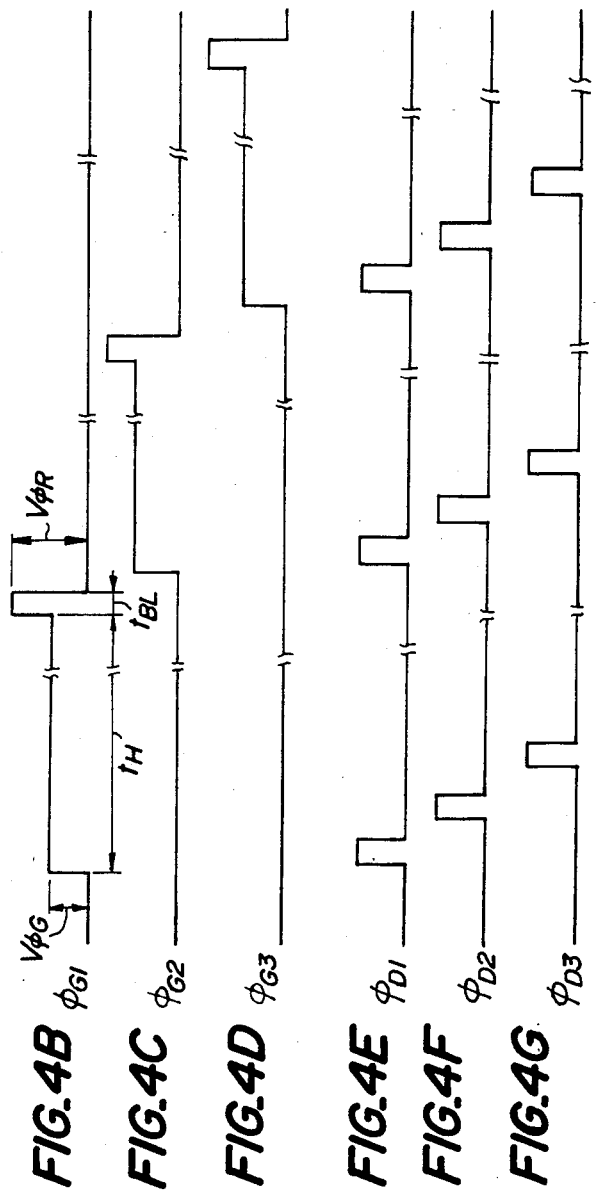

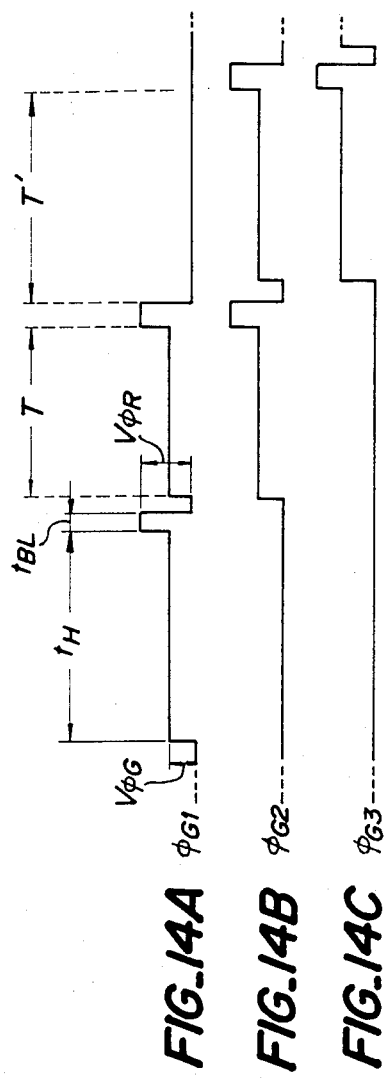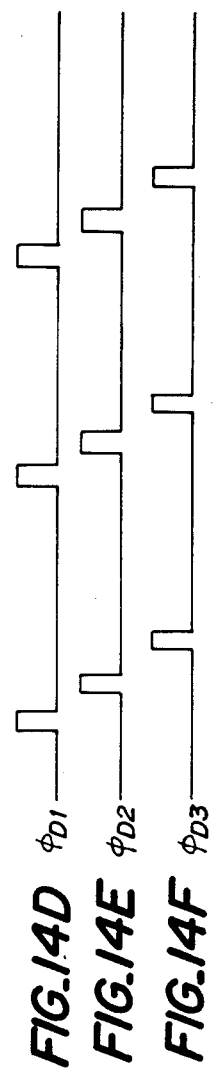

SOLID STATE IMAGE SENSING DEVICE

BACKGROUND OF THE INVENTION

The present invention relates to a solid state image sensing device comprising lateral type static induction transistors or vertical type static induction transistors.

Today, there have been widely used solid state image sensing devices comprising charge transfer elements such as BBD and CCD or MOS type transistors. However, the known solid state image sensing devices have various problems such as leakage of charge during the transfer, low photodetection sensitivity and low integration density. In order to avoid all the drawbacks of the known solid state image sensing devices, there has been proposed a solid state image sensing device comprising static induction transistors (hereinafter abbreviated as SIT). For instance, in a Japanese Patent Application Laid-open Publication No. 15,229/80, there is disclosed a solid state image sensing device comprising a number of SITs arranged in a matrix form, sources of the SITs being connected to row lines, drains being connected to column lines and gates being connected to a clear line. Further, in a solid state image sensing device comprising lateral static induction transistors (hereinafter abbreviated as LSIT), there has been developed an output system in which a light signal is directly derived as a common source configuration or a source follower configuration with a combination of a pixel and a resistor. For instance, in the Japanese Patent Application No. 59,525/84 filed on Mar. 29, 1984, there is proposed a solid state image sensor element. In this solid state image sensor-element, source and drain regions of a SIT are formed in a semiconductor layer applied on an insulating or highly resistive semiconductor substrate, and a gate region of the SIT is so formed in the semiconductor layer that it completely surrounds one of the source and drain regions, whereby a source-drain current flows in parallel with a surface of the semiconductor layer.

In the above Japanese Patent Application, there is further disclosed a solid state image sensing device comprising a number of image sensing elements each including an insulating or highly resistive semiconductor substrate, a semiconductor layer applied on the substrate source and drain regions formed in the semiconductor layer, and a gate region having at least a portion thereof formed between the source and drain regions, whereby a source-drain current flows in parallel with a surface of the semiconductor layer, and means for reverse biasing the source and drain regions during a time period for storing light signal.

Further, in the above Japanese Patent Application, there is proposed a solid state image sensing device comprising a number of solid state image sensor elements arranged in a matrix form, each element including a static induction transistor which comprises an insulating or highly resistive semiconductor substrate, a semiconductor layer formed on the substrate, source and drain regions formed in a surface of the semiconductor layer, a gate region having at least a part thereof formed between the source and drain regions, whereby a source-drain current flows in parallel with the surface of the semiconductor layer, and scanning means for biasing successive solid state image sensor elements in such a manner that during a light signal storing period used for storing photocarrier into the gate region, the source and drain region are reverse biased so as not to produce an output signal, and during a signal readout period the source or drain region is connected to ground to flow the source-drain current corresponding to the photocarriers stored in the gate region onto a video line.

Now the above mentioned solid state image sensing device will be further explained in detail. FIG. 1 is a circuit diagram showing a construction of a pixel of the solid state image sensing device compound of n-channel SITs connected as the common source configuration. In the drawing, a terminal 1 is a source terminal to which a source voltage $V_S$ is applied, and a terminal 2 is a drain terminal to which a drain voltage $V_D$ is applied. The terminal 2 is coupled with a drain electrode (D) via a load resistor $R_L$ and the drain electrode is further connected to an output terminal 5 from which an output voltage $V_{OUT}$ is derived. A terminal 3 constitutes a gate terminal and is connected to a gate electrode (G) upon which a light ray 7 is made incident. To a substrate terminal 8 is applied a substrate voltage $V_{SUB}$.

FIGS. 2A to 2D are waveforms for explaining the operation of the solid state image sensor element shown in FIG. 1. FIG. 2A illustrates a change of the gate voltage $V_G$ applied to the gate terminal 3, FIG. 2B a change of the drain voltage $V_D$ applied to the drain terminal 2, FIG. 2C the source voltage $V_S$ applied to the source terminal 1, and FIG. 2D represents the substrate voltage $V_{SUB}$ applied to the substrate terminal 8. In the drawing a period of read out operation is denoted by T and is composed of store time $T_1$, readout time $T_2$ and reset time $T_3$.

During the whole read out periods, the source voltage $V_S$ is maintained at ground voltage $V_{S1}$ and the substrate voltage $V_{SUB}$ is kept at a reverse bias voltage $V_{SUB1}$ ($V_{SUB1} < 0$). During the store time $T_1$, the gate voltage $V_G$ remains at a deep reverse bias voltage $V_{G1}$ ($V_{g1} < 0$) and thus, holes induced by the incident light ray 7 are stored in an interface between the semiconductor body and the insulating film immediately below the gate region. It should be noted that during the store time $T_1$, the drain voltage $V_D$ is kept at ground voltage $V_{D1}$. During the readout time $T_2$ subsequent to the store time $T_1$, the gate voltage $V_G$ is changed to a gate readout voltage $V_{G2}$ ($V_{G1} \leq V_{G2} < 0$) and the drain voltage $V_D$ is changed into $V_{D2}$ ($V_{D2} > 0$), so that the output signal is derived in accordance with an incident light amount. During the reset time $T_3$ subsequent to the readout time $T_2$, the gate voltage $V_G$ is changed to a forward biase voltage $V_{G3}$ ($V_{G3} > 0$) and thus holes generated by the light input and stored below the gate are discharged. In the drawing, the drain voltage $V_D$ is maintained at the readout voltage $V_{D2}$ during the reset time $T_3$, but it may be the ground voltage $V_{D1}$.

FIG. 3 is a graph showing the output voltage $V_{OUT}$ obtained at the output terminal 5 and the light amount l impinging upon the gate electrode 6. The light amount l is shown by a linear scale. When the light amount l is zero, the LSIT constituting the pixel is remained in the OFF condition and the output voltage $V_{OUT}$ is equal to the drain voltage $V_D$. As the light amount l is gradually increased, the LSIT becomes more conductive and the output voltage $V_{OUT}$ is gradually decreased. When the light amount l becomes larger than a saturation value $l_1$, the output voltage $V_{OUT}$ remains at a constant voltage $V_{OUT1}$. Up to the saturation value $l_1$, it has been experimentally confirmed that the output voltage $V_{OUT} \propto$ the light amount l.

Now, the solid state image sensing device comprising a number of the above LSITs arranged in a matrix form will be explained with reference to FIGS. 4A to 4G. In the solid state image sensing device, the solid state image sensor elements arranged in a matrix form is raster-scanned to derive an image signal, there have been developed various scanning methods such as the drain-gate selection method, the source-gate selection method, and the source-drain selection method. Hereinbelow, the drain-gate selection method will be explained.

FIG. 4A is a circuit diagram showing a construction of the solid state image sensing device comprising the above mentioned LSITs arranged in a matrix form and FIGS. 4B to 4G illustrate signal waveforms for explaining the operation of the image sensing device. As shown in FIG. 4a, m×n LSITs 250-11, 250-12, . . ., 250-21, 250-22 . . ., 250-mn are arranged in a matrix form and are successively readout in accordance with the XY address system. Each pixel may be formed not only by a lateral static induction transistor having the gate region surrounding at least one of the source and drain regions, or by a lateral static induction transistor having the gate region formed between the source and drain regions. Source terminals of the LSITs are connected to ground, gate terminals of the LSITs arranged in the X direction are connected to respective row lines 251-1, 251-2 . . . 251-m, and drain terminals of the LSITs arranged in the Y direction are connected to respective column lines 252-1, 252-2 . . . 252-n. The column lines are commonly connected to a video line 254 and a ground line 254′ via column selection transistors 253-1, 253-2, . . . 253-n and 253-1′, 253-2′ . . . 253-n′, respectively. The video line 254 is further connected via a load resistor 255 to a video voltage source $V_{DD}$. The row lines 251-1, 251-2 . . . 251-m are connected to a vertical scanning circuit 256 and are successively supplied with signals $\phi_{G1}$, $\phi_{G2}$ . . . $\phi_{Gm}$. Gate terminals of the column selection transistors 253-1, 253-2 . . . 253-n and 253-1′, 253-2′ . . . 253-n′ are connected directly and via inverters, respectively to a horizontal scanning circuit 257, and thus receive signals $\phi_{D1}$, $\phi_{D2}$ . . . $\phi_{Dn}$ and their inverted signals.

FIGS. 4B to 4D show the vertical scanning signals $\phi_{G1}$, $\phi_{G2}$ and $\phi_{G3}$ and FIGS. 4E to 4G illustrate the horizontal scanning signals $\phi_{D1}$, $\phi_{D2}$ and $\phi_{D3}$. Each of the vertical scanning signals $\phi_{G1}$, $\phi_{G2}$ . . . applied to the row lines 251-1, 251-2 . . . is comprised of a readout gate voltage $V_{\phi G}$ having a first amplitude and a reset gate voltage $V_{\phi R}$ having a second amplitude larger than the first amplitude. During a row scanning period $t_H$, the scanning signal assumes the voltage $V_{\phi G}$ and during a horizontal blanking period $t_{BL}$ the scanning signal is set to the voltage $V_{\phi R}$. The horizontal scanning signals $\phi_{D1}$, $\phi_{D2}$ . . . applied to the gate terminals of the column selection transistors are those for selecting the column lines 252-1, 252-2 . . . and assume a low level for cutting off the column selection transistors 253-1, 253-2 . . . and making conductive the anti-selection transistors 253-1′, 253-2′ . . ., and a high level for making conductive the column selection transistors and cutting off the anti-selection transistors.

When the vertical scanning signal $\phi_{G1}$ supplied from the vertical scanning circuit 256 is changed to the voltage $V_{\phi G}$, the LSITs 250-11, 250-12 . . . 250-1n connected to the row line 251-1 are selected. When the horizontal selection transistors 253-1, 253-2 . . . 253-n are made successively conductive by means of the signals $\phi_{D1}$, $\phi_{D2}$ . . . supplied from the horizontal scanning circuit 257, the output signals from the LSITs 250-11, 250-12 . . . 250-1n are successively read out on the video line 254. These LSITs 250-11, 250-12 . . . 250-1n are simultaneously reset when the signal $\phi_{G1}$ is changed to the higher voltage $V_{\phi R}$ so as to prepare for a next light signal accumulating operation. Next when the signal $\phi_{G2}$ becomes the voltage $V_{\phi G}$, LSITs 250-21, 250-22 . . . 250-2n connected to the row line 251-2 are selected and are successively readout with the aid the horizontal scanning signals $\phi_{D1}$, $\phi_{D2}$ . . . $\phi_{Dn}$, and after that are simultaneously reset when the signal $\phi_{G2}$ is changed to the voltage $V_{\phi R}$. In the manner explained above, successive LSITs are readout to obtain a video signal of one field.

In the solid state image sensing device, the higher the incident light is, the lower the output signal is obtained. That is to say, the output signal is derived as an inverted phase with respect to the input light signal. Therefore, the output signal always contains the output value $V_{OUT-1}$ corresponding to the saturated input light. Therefore, the output signal has to be processed away from the solid state image sensor elements, and thus, it is necessary to provide additional external circuitry. Due to the fact that the video signals read out of the solid state image sensor elements have to be postprocessed by the external circuit, it becomes difficult to compensate variation between individual pixels and individual chips. Therefore, the manufacturing yield of the solid state image sensing device is low. Further, it is apparent that the manufacturing cost is increased due to the incorporation of the external circuit.

SUMMARY OF THE INVENTION

The present invention has for its object to provide a novel and useful solid state image sensing device which can avoid the above mentioned drawbacks, can provide superior properties and can be manufactured easily.

It is another object of the invention to provide a solid state image sensing device in which psuedo or noise components are subtracted from output signals supplied from image sensor elements and output signals proportional to light input can be obtained without processing the signals by an external circuit other than the solid state image sensor elements.

According to the invention, a solid state image sensing device comprises a semiconductor chip upon which a light input is made incident;

solid state image sensing means formed in the semiconductor chip and including a plurality of pixels each having an amplifying function to produce a picture signal; and differential means formed in the semiconductor chip for deriving a differential output between the picture signal and a dark signal; wherein the differential output is derived from the semiconductor chip.

DESCRIPTION OF THE DRAWINGS

FIGS. 14A to 14F are waveforms for explaining the operation of the device shown in FIG. 13.

DESCRIPTION OF THE PREFERRED EMBODIMENTS

Figure 5:
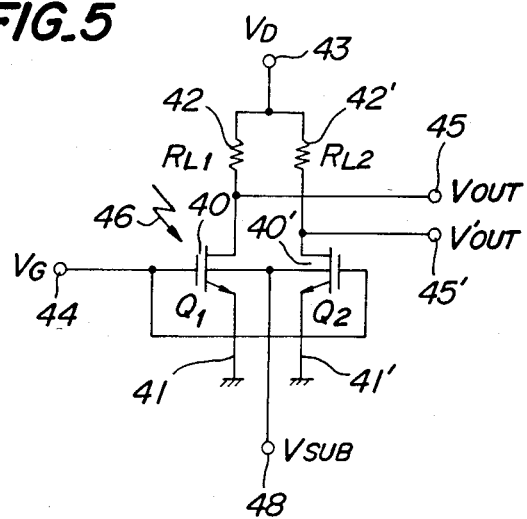
FIG. 5 is a schematic diagram showing an embodiment of an image sensor element of the solid state image sensing device according to the invention.

FIG. 5 is a circuit diagram showing a basic construction of an embodiment of the solid state image sensing device according to the invention. In FIG. 5, there are provided a light receiving transistor (Q1)40 and a transistor (Q2)40' which has the same construction as that of the transistor 40 and which supplies an output which is obtained when light input is zero. This may be achieved by providing a light shielding layer above the transistor 40' or by resetting the transistor 40' upon the read out. Source terminals 41 and 41' connected to source electrodes of the transistors 40 and 40' are connected to a source voltage (the ground voltage) and drain electrodes of the transistors 40 and 40' are connected via respective load resistors ($R_{L1}$)42 and ($R_{L2}$)42' to a common drain terminal 43 to which a drain voltage $V_D$ is applied. Gate electrodes of the transistors 40 and 40' are commonly connected to a gate terminal 44 to which a gate voltage $V_G$ is applied and a substrate is commonly connected to a substrate terminal 48 to which a substrate voltage $V_{SUB}$ is applied. The load resistors 42 an 42' have the same resistance $R_{L1}=R_{L2}$. Output terminals 45 and 45' are connected to junctions between the resistors 42 and to 42' and the drain electrodes of transistors 40 and 40', respectively.

Figure 1:
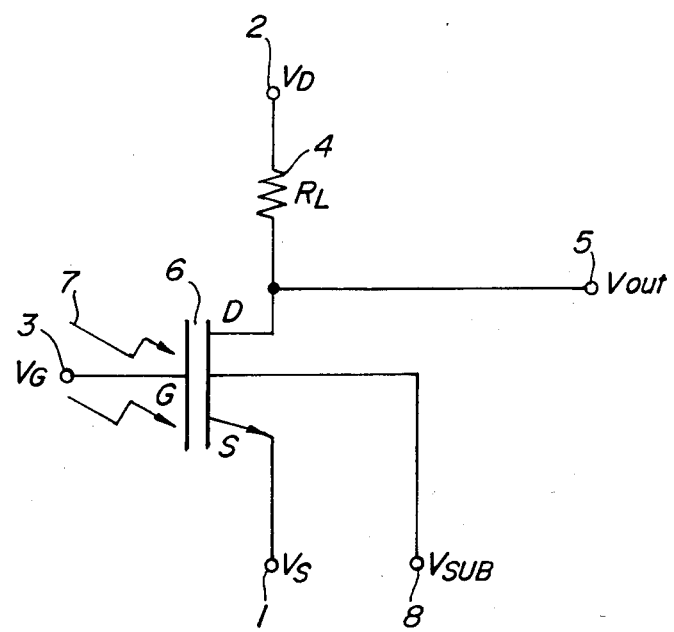
FIG. 1 is a schematic diagram showing a basic construction of an image sensor element of a solid state image sensing device.
Figure 2:
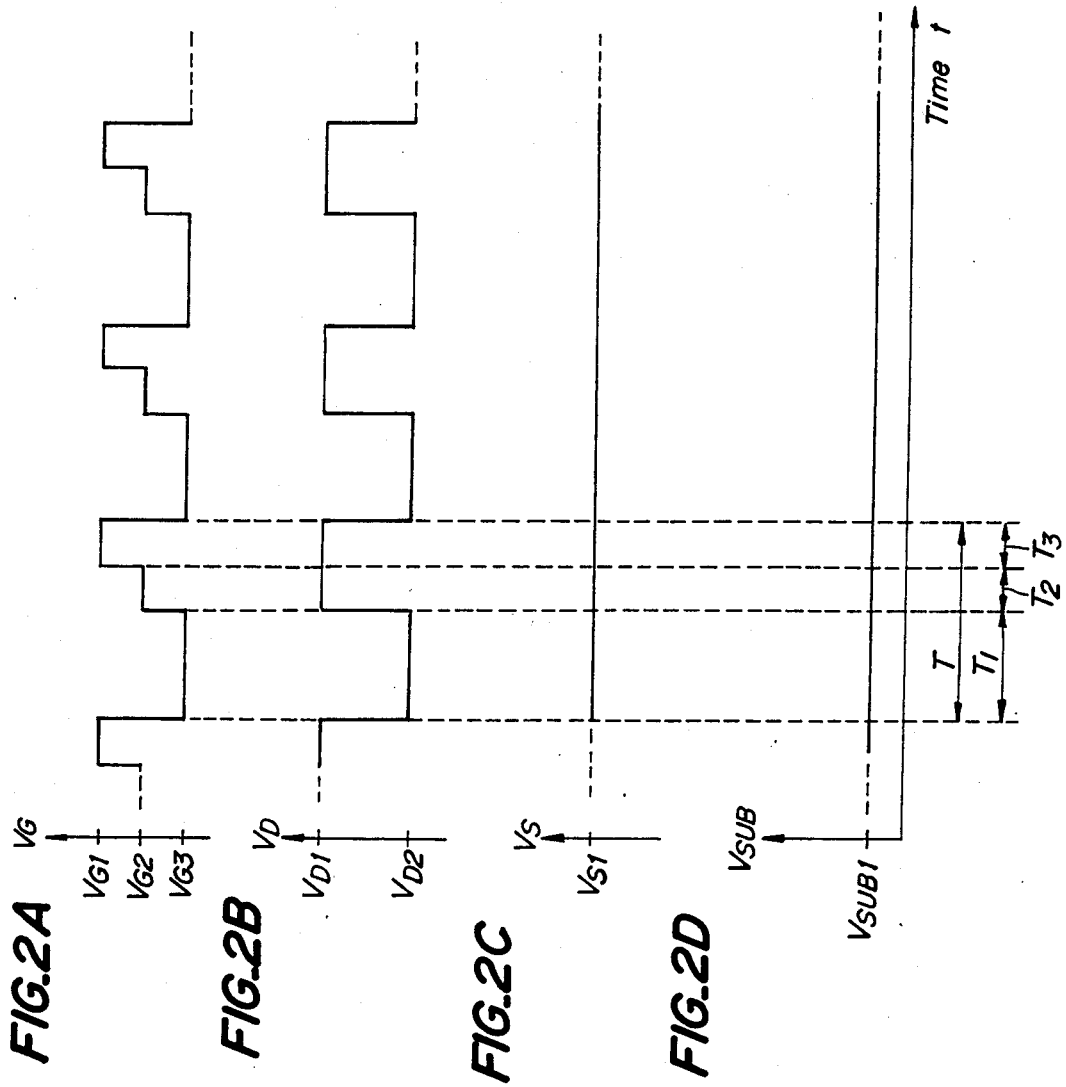
FIGS. 2A to 2D are waveforms for explaining the operation of the device shown in FIG. 1.
Figure 3:
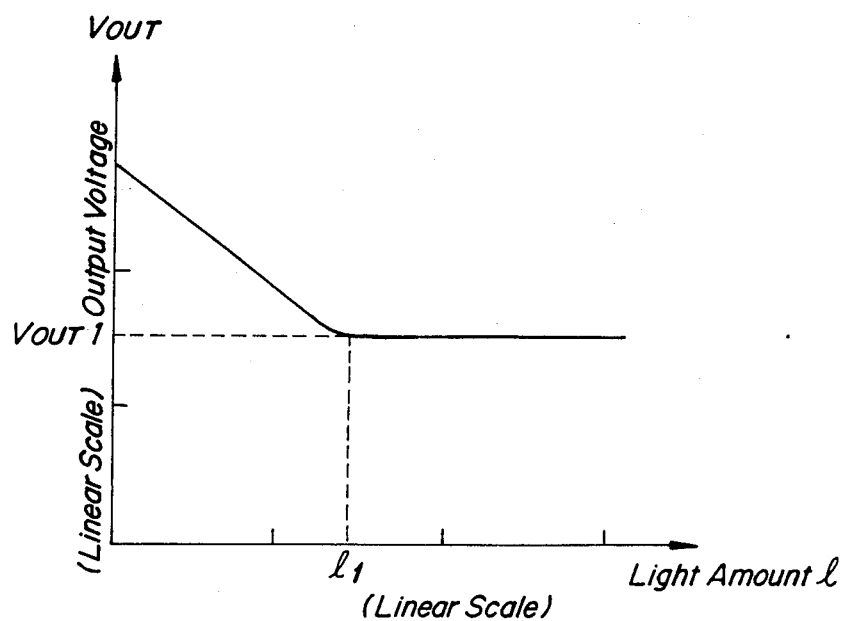
FIG. 3 is a graph depicting an output video signal derived from the device shown in FIG. 1.
Figure 4A:
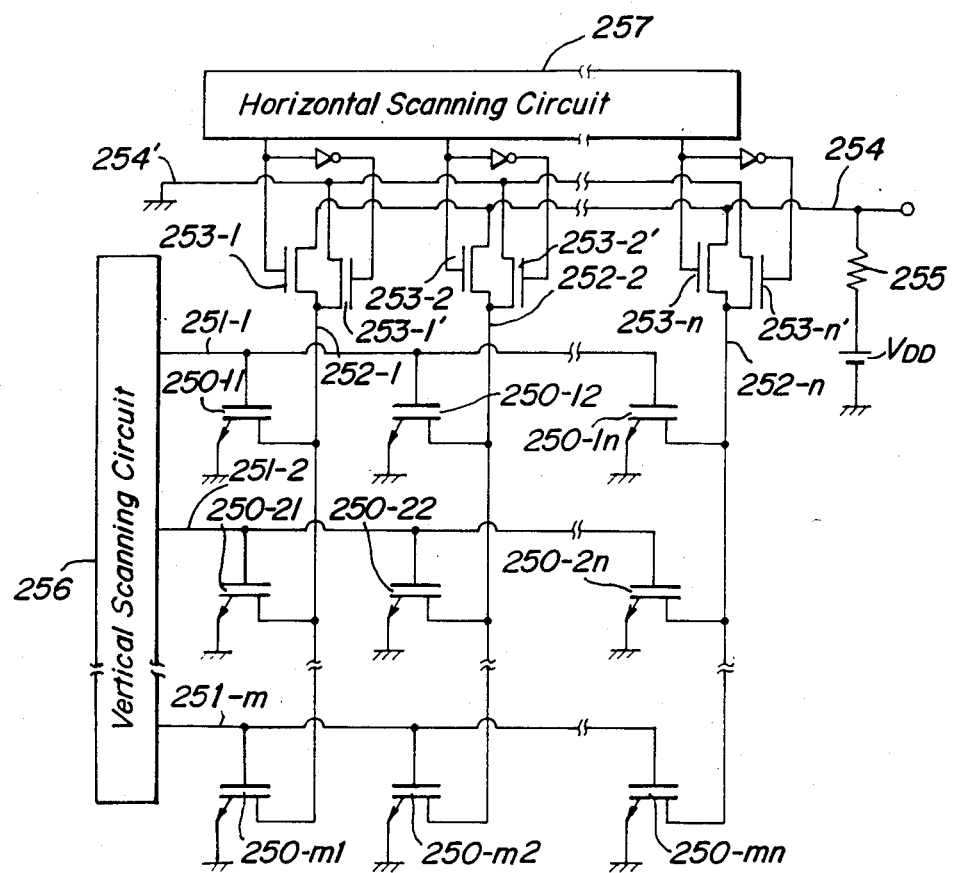
FIG. 4A is a circuit diagram illustrating a construction of the solid state image sensing device comprising the image sensor elements shown in FIG. 1.
Figure 6:
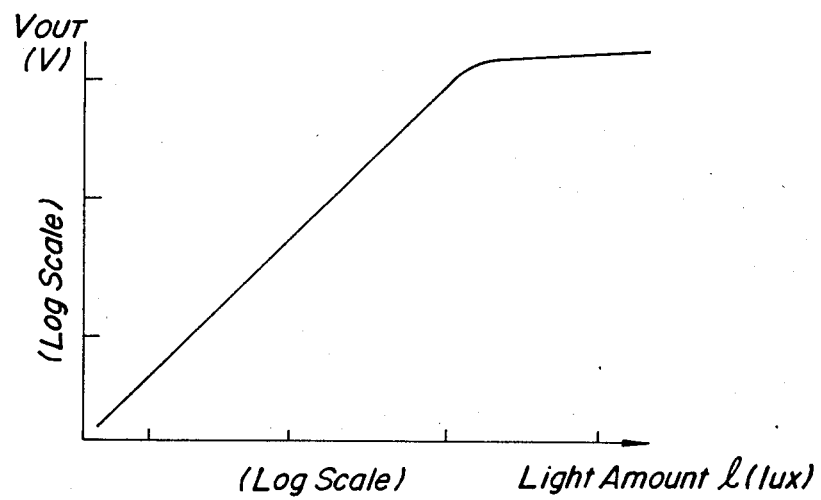
FIG. 6 is a graph depicting a relation between an incident light amount and an output video signal.

The solid state image sensor element shown in FIG. 5 operates in a similar manner to that shown in FIGS. 1 and 2 and thus its detailed explanation is omitted. At the output terminal 45 there is obtained an output signal $V_{OUT}$ in proportion to a light input 46, while at the output terminal 45' there is obtained an output signal $V_{OUT}$ corresponding to zero light input. When a difference between the output signals is derived $\Delta V_{OUT} = V'_{OUT} - V_{OUT}$, the difference $\Delta V_{OUT}$ (volts) is in proportion to the light amount l (flux) as shown in FIG. 6.

Now, several embodiments of the solid state image sensing device according to the invention which operates in accordance with the above operational principle will be explained.

Figure 7:
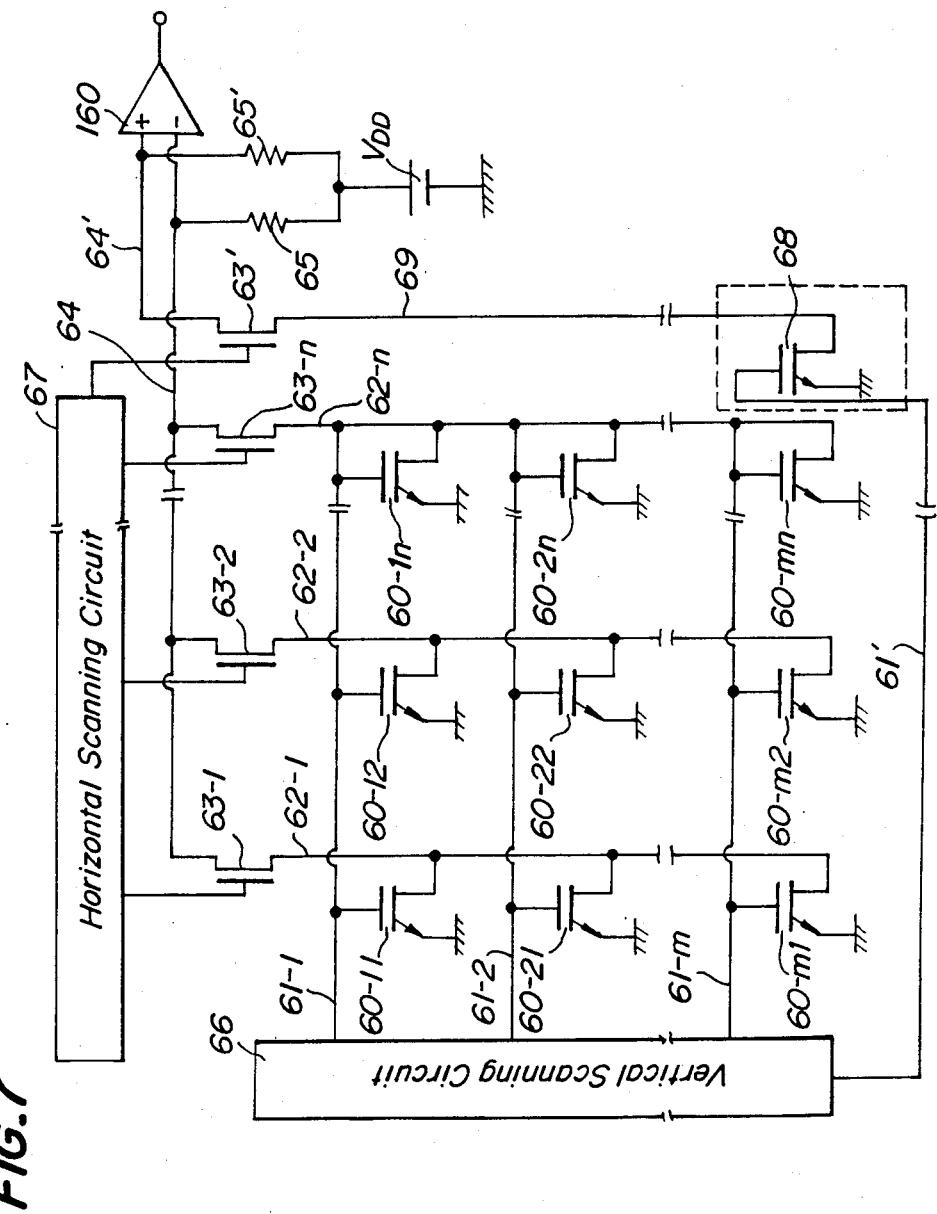
FIG. 7 is a circuit diagram illustrating an embodiment of the solid state image sensing device according to the invention.

FIG. 7 is a circuit diagram showing an embodiment of the solid state image sensing device according to the invention. In this embodiment, a differential output is derived by using a single dummy cell. The solid state image sensing device comprises a number of solid state image sensor elements arranged in a matrix form which are raster-scanned to derive an image signal. The raster-scan may be effected by various scanning methods such as the drain-gate selection method, the source-gate selection method, and the source-drain selection method. Hereinbelow, the drain-gate selection method will be explained. As shown in FIG. 7, m×n LSITs 60-11, 60-12 ... 60-21, 60-22 ..., 60-mn are arranged in a matrix form and are successively readout in accordance with the XY address system. Each pixel may be formed not only by a lateral static induction transistor having the gate region surrounding at least one of the source and drain regions, but also by a lateral static induction transistor having the gate region formed between the source and drain regions. In this embodiment, source terminals of LSITs are connected to the ground, gate terminals of LSITs arranged in the X directon are connected to respective row lines 61-1, 61-2 ... 61-m, and drain terminals of LSITs arranged in the Y direction are connected to respective column lines 62-1, 62-2 ... 62-n. The column lines are commonly connected to a first video line 64 via column selection transistors 63-1, 63-2 ... 63-n. The video line 64 is further connected via a first load resistor 65 to a video voltage source $V_{DD}$. The row lines 61-1, 61-2 ... 61-m are connected to a vertical scanning circuit 66 and are successively supplied with signals $\phi_{G1}, \phi_{G2} ... \phi_{Gm}$. Gate terminals of the column selection transistors 63-1, 63-2 ... 63-n are connected to a horizontal scanning circuit 67, and thus receive horizontal scanning signals $\phi_{D1}, \phi_{D2} ... \phi_{Dn}$.

In the present embodiment, there is further provided a dummy transistor 68 having a source electrode connected to the ground. Above the dummy transistor 68 is provided a light shielding film such as an Al film so that input light is not made incident upon the dummy transistor 68. A drain electrode of the dummy transistor 68 is connected to a line 69 which is then connected via a selection transistor 63' to a second video line 64' which is further connected to the video voltage source $V_{DD}$ through a second load resistor 65'. The first and second video lines 64 and 64' are further connected to negative and positive inputs, respectively of a differential amplifier 160 formed in a semiconductor chip in which all the LSITs and column selection transistors are formed. A gate terminal of the dummy transistor 68 is connected via a line 61' to the vertical scanning circuit 66 to receive a signal which corresponds to a logical sum (OR) signal of the vertical scanning signals $\phi_{G1}, \phi_{G2} ... \phi_{Gm}$. A gate terminal of the selection transistor 63' is connected to the horizontal scanning circuit 67 and receives a logical sum signal of the horizontal scanning signals $\phi_{G1}, \phi_{G2} ... \phi_{Gm}$. The load resistors 65 and 65' have the same resistance value.

Figure 8:
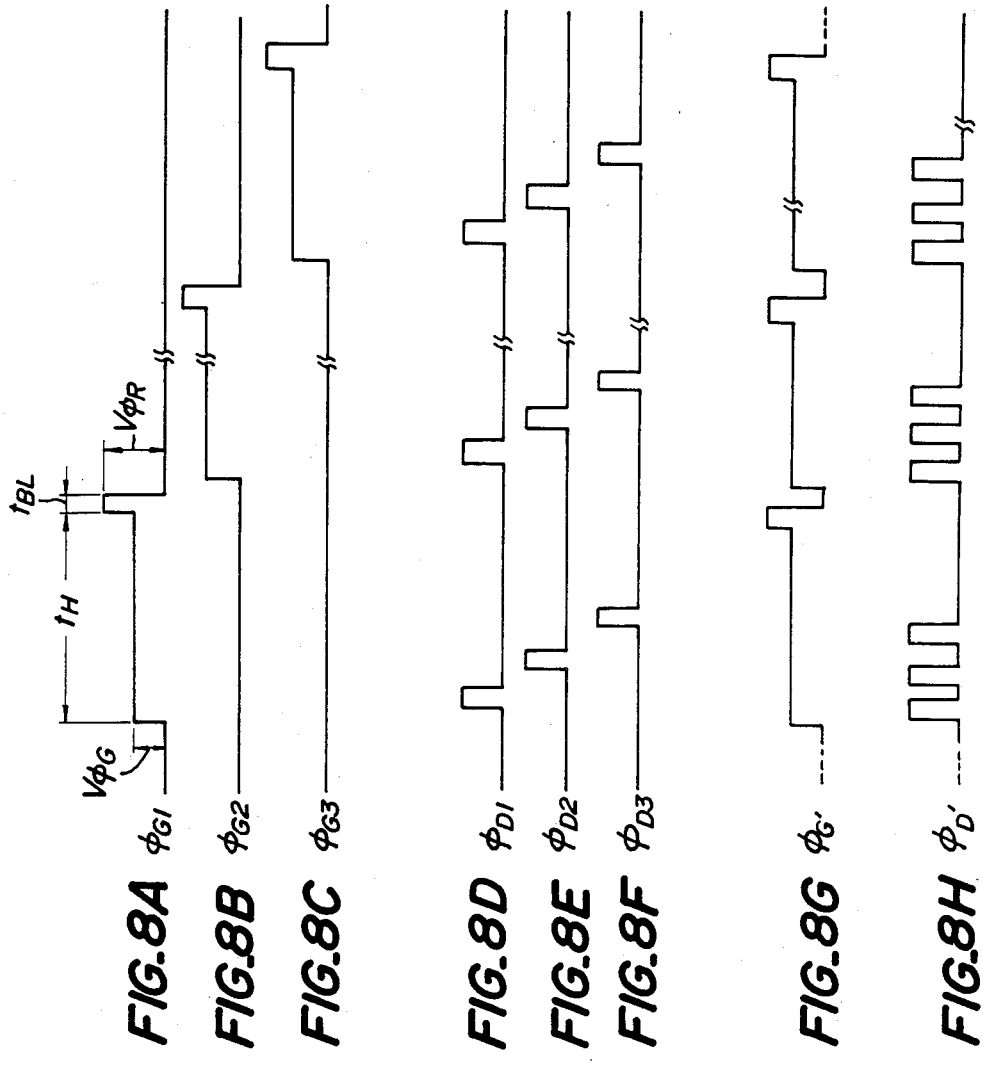
FIGS. 8A to 8H are waveforms for explaining the operation of the device shown in FIG. 7.

Next, the operation of the solid state image sensing device shown in FIG. 7 will be explained with reference to waveforms illustrated in FIGS. 8A to 8H. FIGS. 8A to 8C show the vertical scanning signals $\phi_{G1}, \phi_{G2}$ and $\phi_{G3}$, FIGS. 8D to 8F illustrate the horizontal scanning signals $\phi_{D1}, \phi_{D2}$ and $\phi_{D3}$, and FIGS. 8G and 8H depict the logic sum signals applied to the gate terminals of the dummy transistor 68 and selection transistor 63', respectively. Each of the vertical scanning signals $\phi_{G1}, \phi_{G2}$ ... applied to the row lines 61-1, 61-2 ... comprises a readout gate voltage $V_{\phi G}$ having a first amplitude and a reset gate voltage $V_{\phi R}$ having a second amplitude larger than the first amplitude. During a row scanning period $t_H$, the scanning signal assumes the voltage $V_{\phi G}$ and during a horizontal blanking period $t_{BL}$ the scanning signal is set to the voltage $V_{\phi R}$. The horizontal scanning signals $\phi_{D1}$, $\phi_{D2}$ ... applied to the gate terminals of the column selection transistors are those for selecting the column lines 62-1, 62-2 ... and assume a low level for cutting off the column selection transistors 63-1, 63-2 ... and a high level for making conductive the column selection transistors. As explained above, to the gate line 61' of the dummy transistor 68 is applied the signal $\phi_{G'}$ shown in FIG. 8G, and to the gate terminal of the selection transistor 63' is applied the signal $\phi_D$, illustrated in FIG. 8H.

Now the operation of the solid state image sensing device shown in FIG. 7 will be explained with reference to the waveforms depicted in FIGS. 8A to 8H. When the vertical scanning signal $\phi_{G1}$ supplied from the vertical scanning circuit 66 is changed to the voltage $V_{\phi G}$, the LSITs 60-11, 60-12 ... 60-1n connected to the row line 61-1 are selected. When the horizontal selection transistors 63-1, 63-2 ... 63-n are made successively conductive by means of the signals $\phi_{D1}$, $\phi_{D2}$ ... supplied from the horizontal scanning circuit 67, the output signals from the LSITs 60-11, 60-12 ... 60-1n are successively read out on the first video line 64. During this scanning operation, the dummy transistor 68 is also read out in synchronism with the readout of the SITs 60-11, 60-12 ... 60-1n to derive an output signal on the second video line 64' through the selection transistor 63'. This output signal corresponds to that which will be obtained when no light input is made incident and thus, is called a dark signal. After that the LSITs 60-11, 60-12 ... 60-1n and the summy transistor 68 are simultaneously reset when the signal $\phi_{G1}$ is changed to the higher voltage $V_{\phi R}$ so as to prepare for a next light signal accumulating operation. Next when the signal $\phi_{G2}$ becomes the voltage $V_{\phi G}$, LSITs 60-21, 60-22 ... 60-2n connected to the row line 61-2 are selected and are successively read out with the aid of the horizontal scanning signals $\phi_{D1}$, $\phi_{D2}$ ... $\phi_{Dn}$, and at the same time the dark signal is read out with the aid of the signals $\phi_{G'}$, and $\phi_{D'}$. After that the SITs 60-21, 60-22 ... 60-2n and 68 are simultaneously reset when the signal $\phi_{G2}$ is changed to the voltage $V_{\phi R}$. In the manner explained above, successive LSITs 60-11 ... 60-mn and the dummy transistor 68 are readout to obtain the vodeo signal of one field on the first video line 64 and the dark signal on the second video line 64'. The video signal on the first video line 64 is supplied to the negative input of the differential amplifier 160 and the dark signal on the second video line 64' is supplied to the positive input of the differential amplifier 160. Therefore, from the output of differential amplifier 160, it is possible to obtain the compensated video signal as shown in FIG. 6. That is to say, the vodeo signal appearing at the output of the differential amplifier is proportional to an amount of the input light and becomes precisely zero when no light input is made incident upon the solid state image sensing device. Further, the dummy transistor 68 and the selection transistor 63' for producing the dark signal are formed in the semiconductor chip in which the image sensor elements are formed and thus, the construction of the whole solid state image sensing device can be made small and simple.

Figure 9:
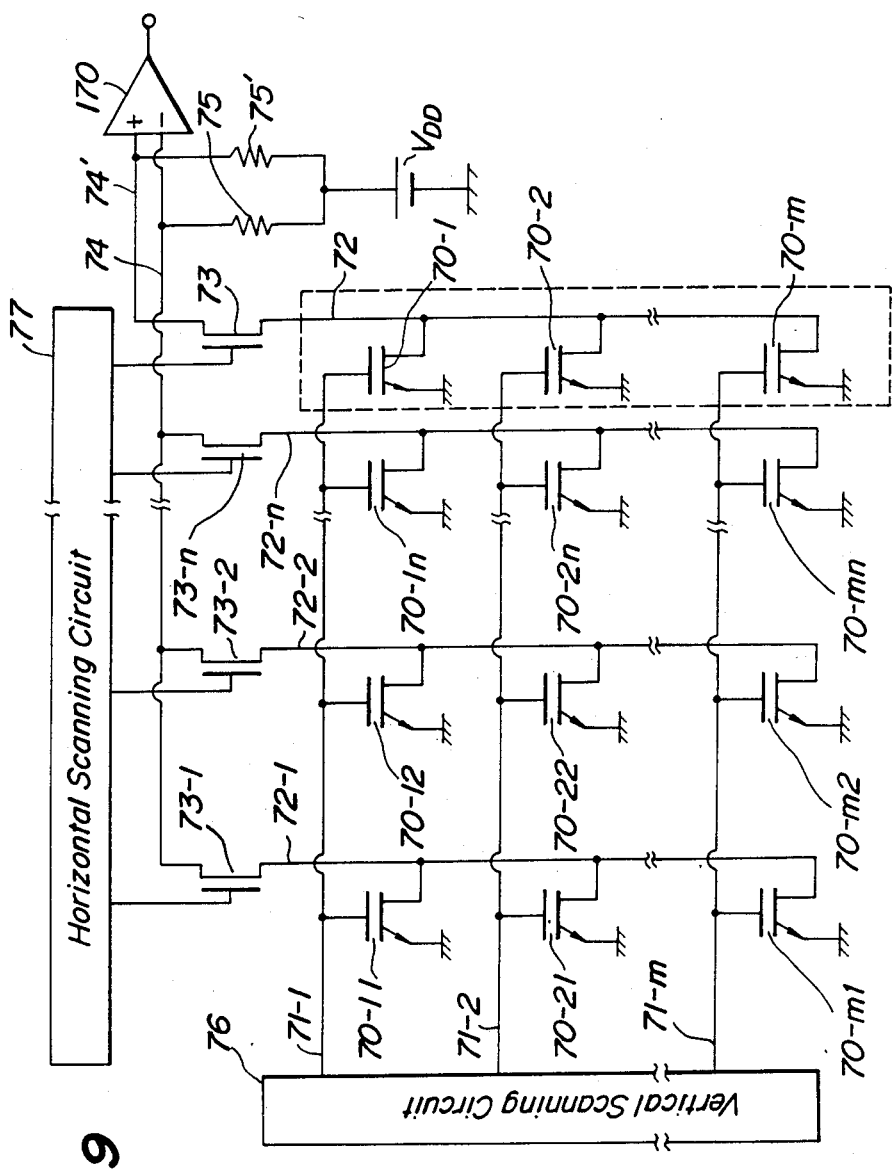
FIG. 9 is a circuit diagram depicting another embodiment of the solid state image sensing device according to the invention.

FIG. 9 is a circuit diagram showing another embodiment of the solid state image sensing device according to the invention. In the present embodiment, the solid state image sensing device is provided with a dummy cell array and is scanned by the drain-gate selection method. In FIG. 9 m×n LSITs 70-11, 70-12 ... 70-21, 70-22 - 70-mn are arranged in a matrix form and are successively readout by the XY address method. The LSIT forming a pixel may be constructed in the same manner as that explained above. Gate terminals of the LSITs arranged in the X direction are connected to respective row lines 71-1, 71-2 ... 71-m, and drain terminals of the LSITs arranged in the Y direction are connected to respective column lines 72-1, 72-2 ... 72-n. Gate terminals of dummy transistors 70-1, 70-2, ... 70-n arranged in the Y direction are connected to respective row lines 71-1, 71-2 ... 71-m and drain terminals of the dummy transistors are commonly connected to an additional column line 72. The column lines 72-1, 72-2 ... 72-n are commonly connected to a first video line 74 via respective column selection transistors 73-1, 73-2 ... 73-n. Further, the additional column line 72 is connected to a second video line 74' through a selection transistor 73. The first and second video lines 74 and 74' are connected to a video voltage source $V_{DD}$ by means of load resistors 75 and 75', respectively. Further, the first and second video lines 74 and 74' are connected to negative and positive inputs, respectively of a differential amplifier 170 formed in the same semiconductor chip as that of the pixel transistors and other transistors. The row lines 71-1, 71-2 ... 71-m are connected to a vertical scanning circuit 76 to receive vertical scanning signals $\phi_{G1}$, $\phi_{G2}$ ... $\phi_{Gm}$. Further gate terminals of the column selection transistors 73-1, 73-2 ... 73-n are connected to a horizontal scanning circuit 77 to receive horizontal scanning signals $\phi_{D1}$, $\phi_{D2}$ ... $\phi_{Dn}$. A gate terminal of the selection transistor 73 is connected to the horizontal scanning circuit 77 to receive a logical sum signal of the horizontal scanning signals $\phi_{D1}$, $\phi_{D2}$ ... $\phi_{Dn}$.

Figure 10:
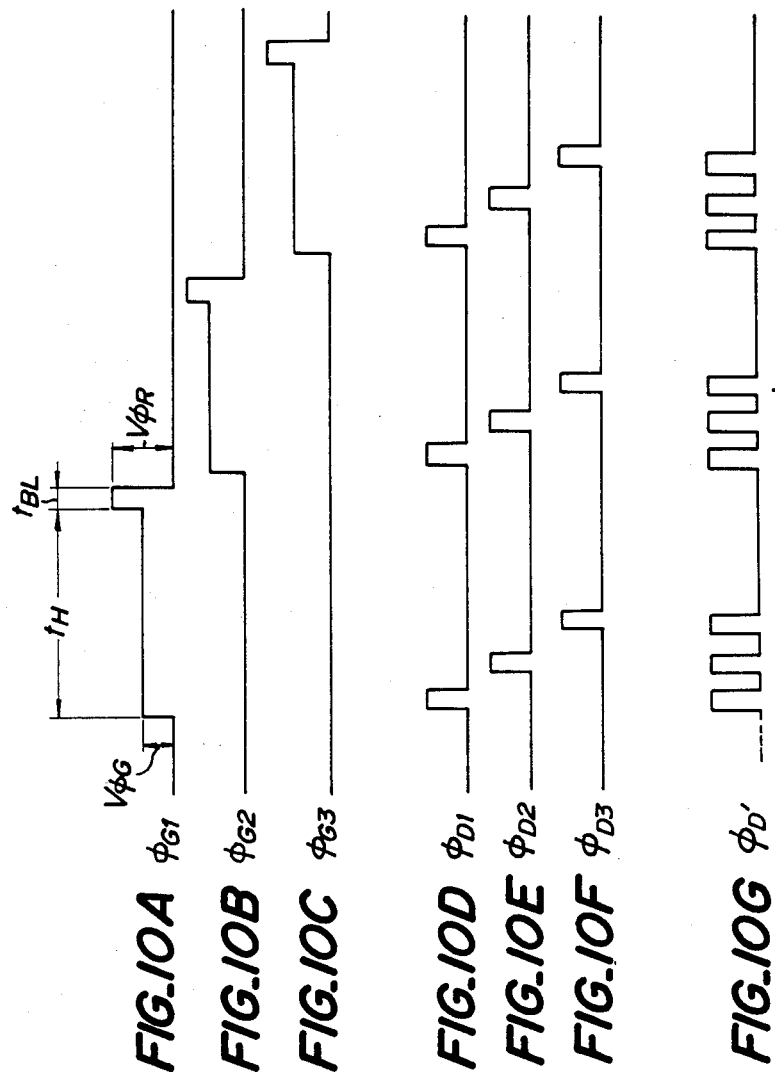
FIGS. 10A to 10G are waveforms for explaining the operation of the device of FIG. 9.

Now the operation of the solid state image sensing device shown in FIG. 9 will be explained with reference to waveforms illustrated in FIGS. 10A to 10G. FIGS. 10A to 10C show the vertical scanning signals $\phi_{G1}$, $\phi_{G2}$, $\phi_{G3}$, FIGS. 10D to 10F the horizontal scanning signals $\phi_{D1}$, $\phi_{D2}$, $\phi_{D3}$ and FIG. 10G depicts the logic sum signal $\phi_{D'}$ applied to the gate of the selection transistor 73. Each of the vertical scanning signals $\phi_{G1}$, $\phi_{G2}$ ... applied to the row lines 71-1, 71-2 ... comprises a readout gate voltage $V_{\phi G}$ having a small amplitude and a reset gate voltage $V_{\phi R}$ having a large amplitude. The vertical scanning signal $\phi_G$ assumes the readout gate voltage $V_{\phi G}$ during horizontal scanning period $t_H$ and the reset gate voltage $V_{\phi R}$ during a horizontal blanking period $t_{BL}$ following $t_H$. The horizontal scanning signals $\phi_{D1}$, $\phi_{D2}$ ... are applied to select the column lines 72-1, 72-2 ... successively each of them comprising a high level signal for making conductive a column selection transistor and a low level signal for cutting off the transistor. As explained above, the dummy scanning signal $\phi_{D'}$ applied to the gate terminal of the selection transistor 73 is the logic sum signal of all the horizontal scanning signals $\phi_{D1}$, $\phi_{D2}$ ... $\phi_{Dn}$.

When the signal $\phi_{G1}$ supplied from the vertical scanning circuit 76 is changed to the readout gate voltage $V_{\phi G}$, LSITs 70-11, 70-12 ... 70-1n and the dummy SIT 70-1 connected to the row line 71-1 are selected. When the column selection transistors 73-1, 73-2 ... 73-n are successively made conductive by means of the horizontal scanning signals $\phi_{D1}$, $\phi_{D2}$ ... $\phi_{Dn}$ supplied from the horizontal scanning circuit 77, the output signals from the selected LSITs 70-11, 70-12 ... 70-1n are successively readout on the first video line 74. During this readout operation for the first row, the dark signal from the dummy transistor 70-1 is read out on the second video line 74' in synchronism with the video signal readout on the first video line 74. It should be noted that the dummy transistors 70-1, 70-2 ... 70-n are shielded from the light input. After that, when the signal $\phi_{G1}$ is changed into the high level voltage $V_{\phi R}$, all the LSITs 70-11, 70-12 ... 70-1n and 70-1 are simultaneously reset for preparing for a next light signal accumulating operation.

Next, the vertical scanning signal $\phi_{G2}$ is changed into the low level voltage $V_{\phi G}$ and LSITs 70-21, 70-22 ... 70-2n and the dummy transistor 70-2 all connected to the second row line 71-2 are selected. These LSITs 70-21, 70-2 ... 70-2n are successively readout by means of the horizontal scanning signals $\phi_{D1}, \phi_{D2} ... \phi_{Dn}$ and the video signal is derived on the first video line 74. At the same time, the dummy transistor 73 is repeatedly readout in synchronism with the scanning for LSITs 70-21, 70-22 ... 70-2n and the dark signal is derived on the second video line 74'. After that, all the SITs 70-21, 70-22 ... 70-2n and dummy transistor 70-2 are simultaneously reset when the vertical scanning signal $\phi_{G2}$ is changed into the higher level voltage $V_{\phi R}$. In the same manner as explained above, the photoelectrically converted light signal and the dark signal are successively readout to obtain the video signal of one field. Also in this embodiment, by deriving a difference between the video signal and dark signal appearing on the first and second video lines, respectively by means of the differential amplifier 170, it is possible to obtain the compensated video signal as shown in FIG. 6. It should be noted that in the present embodiment the dummy transistors 70-1, 70-2 ... 70-m are arranged along the most right-hand column, but these dummy LSITs may be arranged along any other column. Compared with the other embodiment, the present embodiment has a special feature in that the dark signal can be obtained after the same integration time as that during which each light signal is accumulated.

Figure 11:
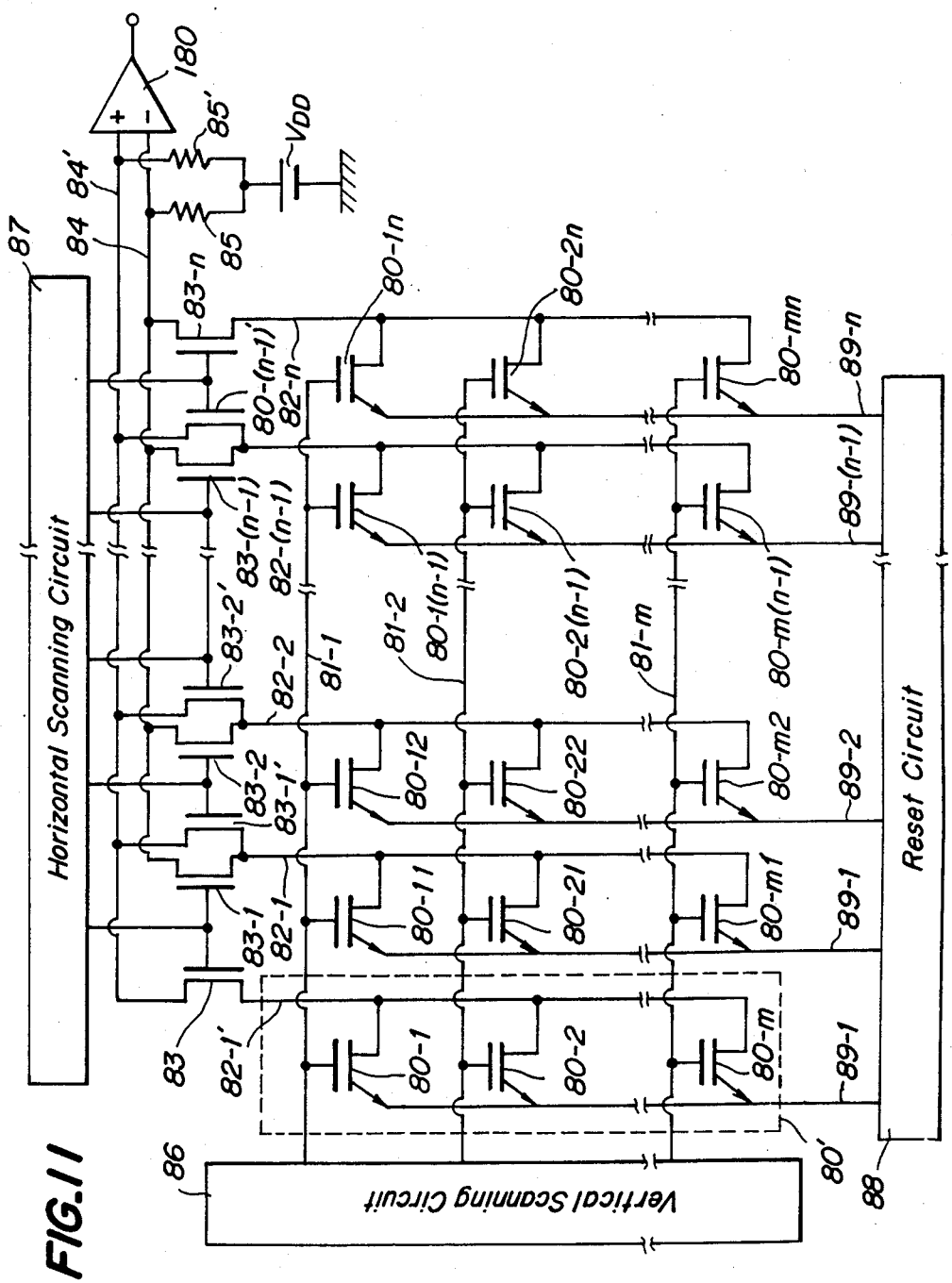
FIG. 11 is a circuit diagram showing still another embodiment of the solid state image sensing device according to the invention.

FIG. 11 is a circuit diagram showing still another embodiment of the solid state image sensing device according to the invention. In the present embodiment, the solid state image sensing device is provided with a dummy cell array and a differential output may be derived between a light signal readout of each pixel and a dark signal readout of a neighboring pixel which may be recognized to be substantially in a dark condition. In FIG. 11 m×n LSITs 80-11, 80-12 ... 80-21, 80-22 ... 80-mn and dummy LSITs 80-1, 80-2 ... 80-m are arranged in a matrix form and are successively readout by the XY address method. The dummy LSITs are covered with a light shielding film 80' shown by a dotted line. The LSIT forming a pixel may be constructed in the same manner as that explained above. Source terminals of LSITs arranged in the Y direction are connected to respective reset lines 89-1, 89-2 ... 89-m, and gate terminals of LSITs arranged in the X-direction are connected to respective row lines 81-1, 81-2 ... 81-m. Drain terminals of LSITs arranged in the Y direction are connected to respective column lines 82-1, 82-2 ... 82-n. Source terminals of dummy LSITs 80-1, 80-1 ... 80-m are commonly connected to dummy reset line 89-1'. Gate terminals of dummy LSITs 80-1, 80-2 ... 80-m are connected to respective row lines 81-1, 81-2 ... 81-m and drain terminals of the dummy LSITs are commonly connected to a dummy column line 82-1'. The column lines 82-1, 82-2 ... 82-n are commonly connected to first and second video lines 84 and 84' via respective column selection transistors 83-1, 83-2 ... 83-n and 83-1', 83-2' ... 83-n', respectively. Further, the dummy column line 82-1' is connected to the second video line 84' via a dummy selection transistor 83. The first and second video lines 84 and 84' are connected to a video voltage source $V_{DD}$ by means of load resistors 85 and 85', respectively having the same resistance value. The first and second video lines 84 and 84' are connected to negative and positive inputs, respectively of a differential amplifier 180 formed in a semiconductor chip in which all the LSITs and other transistors are formed. The row lines 81-1, 81-2 ... 81-m are connected to a vertical scanning circuit 86 to receive vertical scanning signals $\phi_{G1}, \phi_{G1} ... \phi_{Gm}$. Further, a gate terminal of the dummy selection transistor 83 and gate terminals of the column selection transistors 83-1, 83-2 ... 83-n are connected to a horizontal scanning circuit 87 to receive horizontal scanning signals $\phi_{D1}, \phi_{D2} ... \phi_{Dn}$. Further the column selection lines 89-1, 89-2 ... 89-n and dummy reset line 89-1' are connected to a reset circuit 88 to receive reset signals $\phi_{S1}, \phi_{S2} ... \phi_{S'}$, successively.

Figure 12:
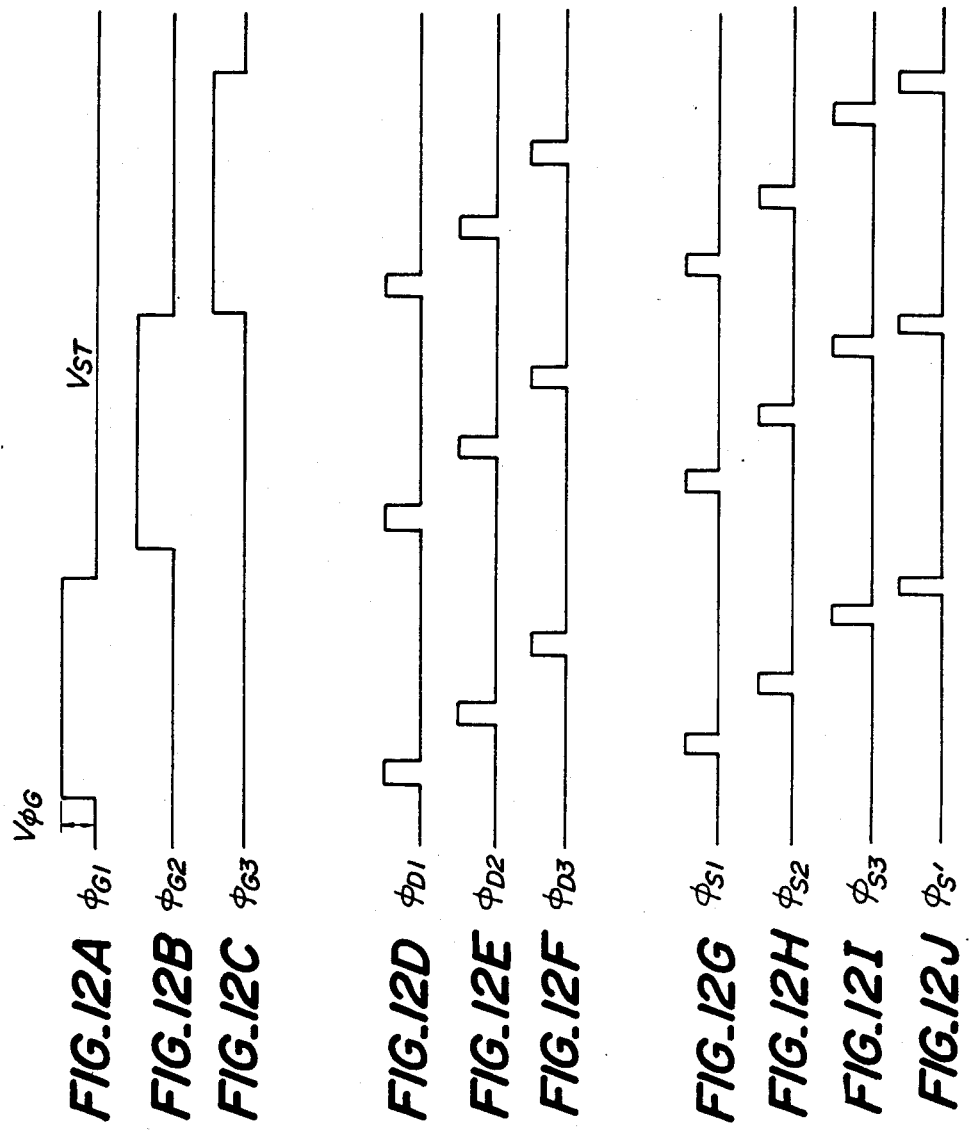
FIGS. 12A to 12J are waveforms for explaining the operation of the device shown in FIG. 11.

Now the operation of the solid state image sensing device shown in FIG. 11 will be explained with reference to waveforms illustrated in FIGS. 12A to 12J. FIGS. 12A to 12C show the vertical scanning signals $\phi_{G1}, \phi_{G2}, \phi_{G3}$, FIGS. 12D to 12F the horizontal scanning signals $\phi_{D1}, \phi_{D2}, \phi_{D3}$, FIGS. 12G to 12I the reset signals $\phi_{S1}, \phi_{S2}, \phi_{S3}$ applied to the reset lines 89-1, 89-2, 89-3, respectively and FIG. 12J depicts a reset signal $\phi_{S'}$ supplied to the dummy reset line 89-1'. Each of the vertical scanning signals $\phi_{G1}, \phi_{G2} ...$ applied to the row lines 81-1, 81-2 ... comprises a light accumulation voltage $V_{st}$ and a readout gate voltage $V_{\phi G}$ having a small amplitude. The vertical scanning signal $\phi_G$ assumes the readout gate voltage $V_{\phi G}$ during a horizontal scanning period $t_H$. The horizontal scanning signals $\phi_{D1}, \phi_{D2} ...$ are applied to select pairs of the column lines 82-1' and 82-1, 82-1 and 82-2 ... successively and each of them comprises a high level voltage for making simultaneously conductive pairs of column selection transistors 83 and 83-1, 83-1' and 83-2, 83-2' and 83-3 .... Each of the reset signals $\phi_{S1}, \phi_{S2}, \phi_{S3} ...$ is generated just after each of LSITs 80-11, 80-12 ... is readout by the respective horizontal scanning signals $\phi_{D1}, \phi_{D2} ...$. That is to say, after the first LSIT 80-11 is read out by the horizontal scanning signal $\phi_{D1}$, the reset signal $\phi_{S1}$ is applied to the reset line 89-1 and thus the revelant LSIT 80-11 is reset. For this purpose, the reset signal has a voltage level which is substantially equal to the readout gate voltage $V_{\phi G}$.

When the signal $\phi_{G1}$ supplied from the vertical scanning circuit 86 is changed to the readout gate voltage $V_{\phi G}$, LSITs 80-11, 80-12 ... 80-1n and the dummy LSIT 80-1 connected to the row line 81-1 are selected. When the column selection signal $\phi_{D1}$ is applied to the gate terminals of the first pair of column selection transistors 83 and 83-1, the column selection line 82-1 and the dummy column line 82-1' are connected to the first and second video lines 84 and 84', respectively. It should be noted that the dummy LSITs 80-1, 80-m have been reset by the reset signal $\phi_S$, in the last field. Therefore, on the first video line 84 there is derived a video signal readout of LSIT 80-11 and at the same time on the second video line 84' there is obtained a dark signal readout of LSIT 80-1. Then, the reset signal $\phi_{S1}$ is supplied from the reset circuit 88 and thus LSIT 80-11 is reset. Next, the horizontal scanning signal $\phi_{S2}$ is applied from the horizontal scanning circuit 87 and a next pair of transistors 83-1' and 83-2 are made conductive and the column line 82-2 and 8201 are connected to the first and second video lines 84 and 84', respectively. Therefore, the video signal of LSIT 80-12 is readout on the first video line 84 and at the same time the dark signal is readout from LSIT 80-11 on the second video line 84'. After that the relevant LSIT 80-12 is reset by the reset signal $\phi_{S2}$ applied on the reset line 89-2.

In the manner explained above, successive LSITs are readout to derive the video signal on the first video line and at the same time successive LSITs which have been reset just after being readout to derive the dark signal on the second video line 84'. Also in this embodiment, by deriving a difference between the video signal and dark signal appearing on the first and second video lines, respectively by means of the differential amplifier 180, it is possible to obtain the compensated video signal as shown in FIG. 6. Compared with the other embodiments, the present embodiment has a special advantage in that since the dark signal is obtained from an adjacent LSIT to a relevant LSIT which is just read out, it is possible to derive a much more accurate dark signal and thus an accurately compensated video signal.

Figure 13:
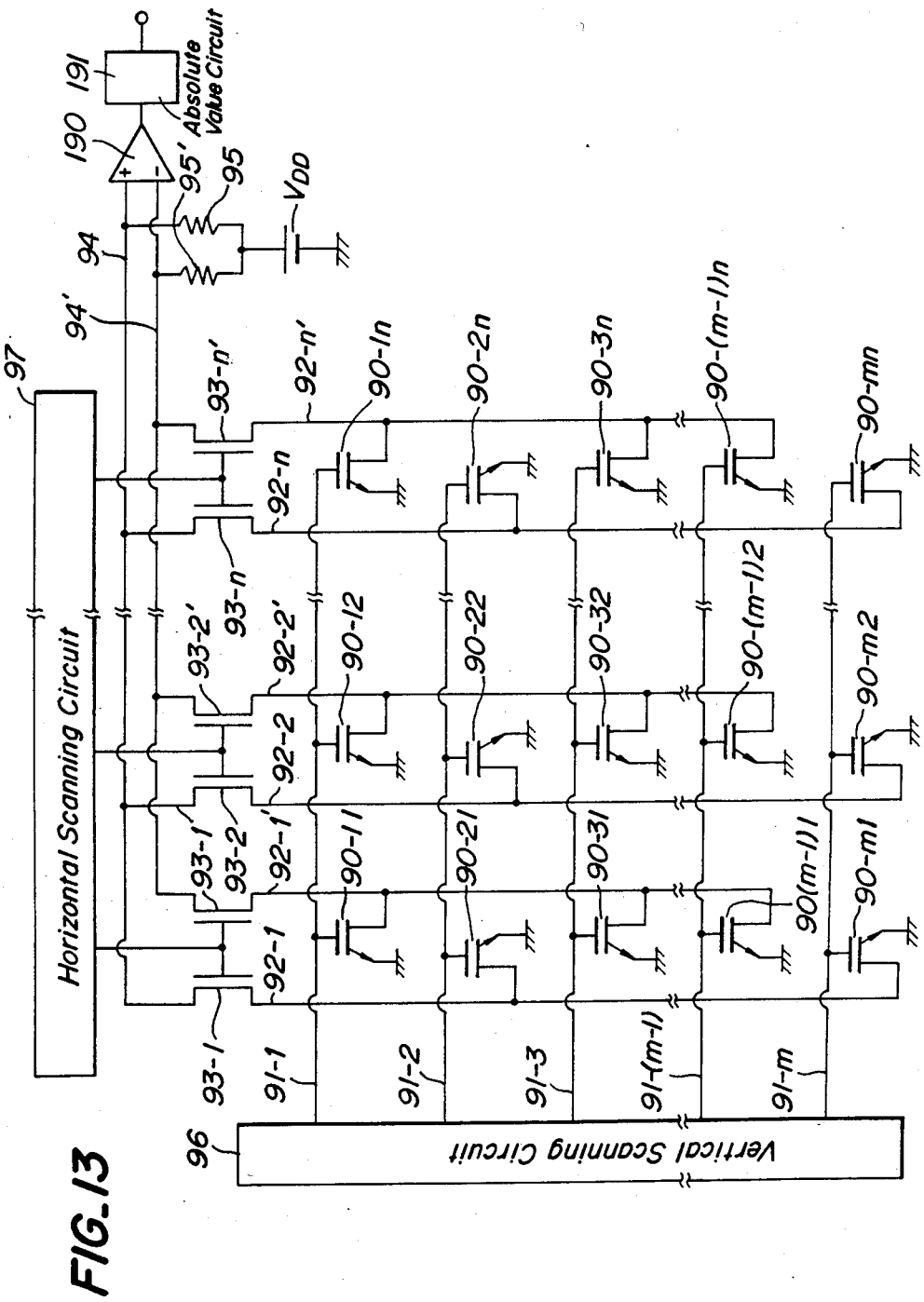
FIG. 13 is a circuit diagram illustrating still another embodiment of the solid state image sensing device according to the invention.

FIG. 13 is a circuit diagram showing still another embodiment of the solid state image sensing device according to the invention. In the present embodiment, the dark signal for compensating the video signal is derived without providing any dummy LSIT. In FIG. 13 m × n LSITs 90-11, 90-12 ... 90-21, 90-22 - 90-mn are arranged in a matrix form and are successively readout by the XY address method. Source terminals of all LSITs are commonly connected to ground. Gate terminals of LSITs arranged in the X direction are connected to respective row lines 91-1, 91-2 ... 91-m. Drain terminals of LSITs connected to odd-numbered row lines 91-1, 91-3, 91-5 ... are connected to respective column lines 92-1', 92-2' ... 92-n', and drain terminals of LSITs connected to even-numbered row lines 91-2, 91-4, 91-6 ... are connected to respective column lines 92-1, 92-2, 92-3 ... . The column lines 9201, 92-2 ... 92-n and 92-1', 92-2' ... 92-n' are connected to first and second video line 94 and 94', respectively via respective column selection transistors 93-1, 93-2 ... 93-n, and 93-1', 93-2' . . . 93-n'. Further, the first and second video lines 94 and 94' are connected to a video voltage source $V_{DD}$ by means of load resistors 95 and 95', respectively having the same resistance velue. The first and second video lines 94 and 94' are connected to positive and negative inputs, respectively of a differential amplifier 190 which is formed in a semiconductor chip in which all the LSITs and other transistors are formed. An output of the differential amplifier 190 is further connected to an absolute value circuit 191 which may be also formed in the same semiconductor chip. The row lines 91-1, 91-2 ... 91-m are connected to a vertical scanning circuit 96 to receive vertical scanning signals $\phi_{G1}, \phi_{G2} \ldots \phi_{Gm}$. Further, gate terminals of pair of the column selection transistors 93-1, 93-1'; 93-2, 93-2'; . . .; 93-n, 93-n' are connected to a horizontal scanning circuit 97 to receive horizontal scanning signals $\phi_{D1}, \phi_{D2} \ldots \phi_{Dn}$.

Now the operation of the solid state image sensing device shown in FIG. 13 will be explained with reference to waveforms illustrated in FIGS. 14A to 14F. FIGS. 14A to 14C shows the vertical scanning signals $\phi_{G1}, \phi_{G2}, \phi_3$, and FIGS. 14D to 14F depict the horizontal scanning signals $\phi_{D1}, \phi_{D2}, \phi_{D3}$. Each of the vertical scanning signals $\phi_{G1}, \phi_{G2} \ldots$ applied to the row lines 91-1, 91-2 ... comprise a readout gate voltage $V_{\phi G}$ having a small amplitude and a reset gate voltage $V_{\phi R}$ having a large amplitude. The vertical scanning signal $\phi_G$ assumes the readout gate voltage $V_{\phi G}$ during a horizontal scanning period $t_H$ and the reset gate voltage $V_{\phi R}$ during a horizontal blanking period $t_{BL}$ following $t_H$. The horizontal scanning signals $\phi_{D1}, \phi_{D2} \ldots$ are applied to select pairs of the column lines 92-1, 92-1'; 922, 92-2'; . . .; 92-n, 92-n' successively and each of them comprise a high level signal for making conductive paired column selection transistors 93-1, 93-1'; 93-2, 93-2'; . . .; 93-n, 93-n' and a low level signal for cutting off the transistors When the signal $\phi_{G1}$ supplied from the vertical scanning circuit 96 is changed to the readout gate voltage $V_{\phi G}$ and LSITs 90-11, 90-12 .. 90-1n connected to the row line 91-1 are selected, the vertical scanning circuit 96 also supplies the vertical scanning signal $\phi_{Gm}$ to the last row line 91-m to select LSITs 90-m1, 90-m2 ... 90-mn which have been reset by the reset voltage $V_{\phi R}$ during the horizontal blanking period $t_{BL}$ in the last field scanning. When the horizontal scanning signal $\phi_{D1}$ is supplied from the horizontal scanning circuit 97, the column selection transistors 93-1 and 93-1' are made conductive simultaneously. Therefore, the video signal is readout of LSIT 90-11 on the second video line 94', and at the same time the dark signal is readout of LSIT 90-m1 on the first video line 94'. Next, upon occurrence of the horizontal scanning signal $\phi_{D2}$, the video signal is readout of LSIT 90-12 on the second video line 94 and at the same time the dark signal is readout of LSIT 90-m2 on the first video line 94. In this manner, the video signals are successively readout of LSITs 90-11, 90-12 ... 90-1n and at the same time the dark signals are successively readout of LSITs 90-m1, 90-m2 ... 90-mn in synchronism with each other. After reading out the first line, the vertical scanning signal $\phi_{G1}$ is changed into the reset voltage $V_{\phi R}$ and all LSITs 90-11, 90-12 . . . 90-1n are reset simultaneously. At the same time, the vertical scanning signal is also increased to the reset voltage $\phi_{VR}$ and thus all LSITs 90-m1, 90-m2 ... 90-mn are also reset simultaneously.

In a next line scanning period T, the vertical scanning signals $\phi_{G1}$ and $\phi_{G2}$ are changed into the readout voltage $V_{\phi G}$ and thus, the first and second row lines 91-1 and 91-2 are selected. When the horizontal scanning signal $\phi_{D1}$ is supplied from the horizontal scanning circuit 97, the video signal from LSIT 90-21 and the dark signal from LSIT 90-11 are simultaneously read out on the first and second video lines 94 and 94', respectively. As explained above, LSIT 90-11 has just been reset at the last horizontal blanking period $t_{BL}$ and therefore, it is possible to obtain the dark signal which is substantially the same as that derived from LSIT kept in the dark condition. In this manner, LSITs 90-21, 90-22, ... 90-2n are successively read out by means of the horizontal scanning signals $\phi_{D1}, \phi_{D2} \ldots \phi_{Dn}$ and a video signal of a second line is obtained on the first video line 94. At the same time, the dark signal is derived on the second video line 94' in synchronism with the video signal. In this manner, according to the invention, since the video signal and dark signal are readout on the first and second video lines 94 and 94' alternately for successive horizontal lines, the differential output signal from the differential amplifier 190 has positive and negative polarities. Therefore, the differential output is supplied to the absolute value circuit 191 to derive an absolute value of the differential output. In this manner, the compensated video signal always having a positive polarity can be obtained. In the present embodiment, compared with other embodiments, there can be obtained a special advantage that it is not necessary to provide a dummy LSIT and therefore the construction becomes simple. Further, in the present embodiment, except for the first row, the dark signal is derived from an adjacent row to a respective row from which the video signal is just read out and thus it is possible to obtain the dark signal precisely.

It should be noted that the present invention is not limited to the embodiments explained above, but many modifications and alternations can be conceived by those skilled in the art within the scope of the invention. For instance, in the above embodiments use is made of the lateral static induction transistor (LSIT), but use may be made of a normally-on vertical static induction transistor. Moreover, in the embodiments explained above, use is made of the n channel SIT, but use may be made of a p channel SIT by inverting the polarity and the conductivity types of impurities.

As explained above in detail, according to the invention since there is obtained the differential output between the video signal and dark signal, it is possible to derive the output video signal which is proportional to the light amount impinging upon the device. In this manner, there can be obtained the video signal of the positive phase which can easily be further processed. Further, since the differential video signal can be obtained directly from the same semiconductor chip in which the light receiving elements are formed, the image sensing device can be made less expensive and further the differential video signal can be derived precisely to obtain the accurate video signal from very weak incident light. Due to this, a possible variation between respective chips can be reduced materially and thus, a yield of manufacturing the image sensing chips can be improved.

Further, when the light receiving element is formed by the lateral type static induction transistor, the differential output can be obtained simply, because the lateral type static induction transistor has a non-destructive readout function and therefore the differential means can be formed merely by the differential amplifier and does not require complicated circuit means such as a sample and hold circuit.

What is claimed is:

1. A solid state image sensing device comprising:
    a semiconductor chip upon which a light input is made incident;
    a plurality of pixels formed in said semiconductor chip in a matrix, each pixel comprising a lateral type static induction transistor, including:
    a substrate having a high resistance;
    a semiconductor layer of a first conductivity type applied on a surface of said substrate, said semiconductor layer having a surface;
    a source region of said first conductivity type formed in the surface of said semiconductor layer;
    a drain region of said first conductivity type formed in the surface of said semiconductor layer; and
    gate means, formed in the surface of said semiconductor layer between said source and drain regions, for storing photocarriers generated by a light excitation, and for controlling a source-drain current flowing in parallel with the surface of said semiconductor layer according to an amount of said stored photocarriers multiplied by an amplification factor;
    scanning means including column and row lines connected to said pixels, horizontal and vertical scanning circuits coupled to said column and row lines, respectively, and a first video output line for scanning said pixels in a XY address mode to generate on said first video output line a picture signal which is inversely proportional to an amount of said light input;
    dark signal generating means including a second video output line and means for producing on said second video output line a dark signal which is substantially inversely proportional to a dark current generated in said lateral static induction transistor, said dark signal generating means further including a column of lateral static induction transistors formed in said semiconductor chip and means for shielding said column from said light input, a lateral static induction transistor of the column belonging to a row being repeatedly read out when a plurality of pixels belonging to the same row are successively read out; and
    differential means formed in said semiconductor chip and connected to said first and second video output lines for producing an output picture signal which is a difference between said dark signal and picture signal and which is directly proportional to an amount of the light input.

2. A device according to claim 1, wherein said differential means comprises first and second output loads connected between a reference potential point and said first and second video output lines, respectively, and a differential amplifier having a positive input terminal connected to a junction between said second video output line and second output load and a negative input terminal connected to a junction between said first video output line and first output load.

3. A device according to claim 2, wherein said first and second output load comprise first and second output resistors having first ends connected to said first and second video output lines, respectively, and second ends commonly connected to a direct current voltage source.

* * * * *